(12) United States Patent
Vervuurt et al.

(10) Patent No.: US 12,729,437 B2
(45) Date of Patent: Sep. 8, 2026

(54) METHOD AND SYSTEM FOR DEPOSITING BORON NITRIDE USING PULSED CHEMICAL VAPOR DEPOSITION

(71) Applicant: ASM IP Holding B.V., Almere (NL)

(72) Inventors: René Henricus Jozef Vervuurt, Leuven (BE); Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/966,660

(22) Filed: Oct. 14, 2022

(65) Prior Publication Data

US 2023/0143678 A1 May 11, 2023

Related U.S. Application Data

(60) Provisional application No. 63/257,546, filed on Oct. 19, 2021.

(51) Int. Cl.
*C23C 16/455* (2006.01)
*C23C 16/34* (2006.01)

(52) U.S. Cl.
CPC ...... *C23C 16/45553* (2013.01); *C23C 16/342* (2013.01); *C23C 16/45536* (2013.01)

(58) Field of Classification Search
CPC ........................ C23C 16/45553; C23C 16/342
See application file for complete search history.

(56) References Cited

U.S. PATENT DOCUMENTS 5,518,780 A * 5/1996 Tamor .................. C23C 16/342 427/561
10,633,740 B2 4/2020 Melnik et al.
2009/0263972 A1* 10/2009 Balseanu ................ H10P 50/73 257/E21.249
2012/0248617 A1* 10/2012 Balseanu ............... B82Y 40/00 257/773
2016/0079056 A1* 3/2016 Harada ............... H10P 14/6336 118/725
2020/0027725 A1* 1/2020 Weimer ............ H01J 37/32357
2022/0076996 A1 3/2022 Blanquart
2022/0235460 A1* 7/2022 Tuominen ......... C23C 16/45536

OTHER PUBLICATIONS

Borazine Safety Data Sheet, Biosynth Carbosynth; Revision date: Jun. 17, 2019; 9pp.
Mitch Jacoby, “Chemical deposition methods to the rescue,” cen. acs.org, C&EN, Jun. 11, 2018, 29-32.
Seokmo Hong et al.; “Ultralow-dielectric-constant amorphous boron nitride,” Nature, vol. 582, Jun. 25, 2020, 511-526.

* cited by examiner

*Primary Examiner* — Dah-Wei D. Yuan
*Assistant Examiner* — Kristen A Dagenais
(74) *Attorney, Agent, or Firm* — Snell & Wilmer L.L.P.

(57) ABSTRACT

Methods and systems for depositing a boron nitride film on a substrate are disclosed. More particularly, the disclosure relates to methods and systems that can be used for depositing a boron nitride film by a pulsed CVD process.

16 Claims, 4 Drawing Sheets

METHOD AND SYSTEM FOR DEPOSITING BORON NITRIDE USING PULSED CHEMICAL VAPOR DEPOSITION

CROSS-REFERENCE TO RELATED APPLICATIONS

This application claims priority to U.S. Provisional Patent Application Ser. No. 63/257,546, filed Oct. 19, 2021, and titled METHOD AND SYSTEM FOR DEPOSITING BORON NITRIDE USING PULSED CHEMICAL VAPOR DEPOSITION, the disclosure of which is hereby incorporated by reference in its entirety.

FIELD OF INVENTION

The present disclosure generally relates to methods and systems suitable for forming electronic devices. More particularly, the disclosure relates to methods and systems that can be used for depositing a boron nitride film by a pulsed deposition process.

BACKGROUND OF THE DISCLOSURE

The down-scaling of semiconductor devices has resulted in improvements in the speed and density of integrated circuits. However, the miniaturization of devices is limited by increased resistance of interconnects and capacitance delay. To overcome this, interconnect materials having low relative dielectric constants (K-values), that have low wet etch rate ratios (WERR) relative to other commonly-used materials, that serve as metal diffusion barriers, and that are thermally, chemically, and mechanically stable, are desirable. This has been difficult to obtain with materials such as low-K SiCO that generally exhibit poor thermo-mechanical properties.

It has been previously demonstrated that amorphous boron nitride can serve as a low-κ dielectric and a diffusion barrier in small, high-performance electronics. (Hong et al. Nature, vol. 582 (2020)). However, the stability of such films may be less than desired. Accordingly, improved methods and systems for forming boron nitride films are desired. Any discussion of problems and solutions set forth in this section has been included in this disclosure solely for the purposes of providing a context for the present disclosure, and should not be taken as an admission that any or all of the discussion was known at the time the invention was made.

SUMMARY OF THE DISCLOSURE

Exemplary embodiments of this disclosure provide a method for depositing a boron nitride film on a surface of a substrate. While the ways in which various embodiments of the present disclosure address drawbacks of prior methods are discussed in more detail below, in general, various embodiments of the disclosure provide methods that can be used to improve the stability and electrical properties of a boron nitride film, including low-k values, as well as low wet etch rate ratios (WERRs).

In various embodiments of the disclosure, a cyclic deposition method of depositing a boron nitride film on a surface of a substrate comprises providing the substrate in a reaction chamber, providing a reactant into the reaction chamber, forming a plasma using the reactant, and pulsing a precursor of boron and nitrogen into the reaction chamber.

In various embodiments, the precursor consists of boron, nitrogen and hydrogen.

In various embodiments, the precursor does not comprise carbon.

In various embodiments, the precursor comprises borazine or a substituted borazine.

In various embodiments, the reactant comprises one or more of an argon-containing gas and a helium-containing gas. In various embodiments, the reactant further comprises hydrogen or nitrogen.

In various embodiments, the reactant comprises at least one of 30-99% argon and/or helium and 1-70% hydrogen. In various embodiments, the reactant comprises at least one of 10-90% argon and 10-90% nitrogen.

In various embodiments, the reactant is provided continuously during the pulsing of the precursor into the reaction chamber.

In various embodiments, the plasma is provided continuously during the pulsing of the precursor into the reaction chamber.

In various embodiments, the plasma is provided directly using capacitively coupled plasma.

In various embodiments, the method comprises a (e.g., plasma-enhanced) cyclical CVD process.

In various embodiments, a pressure within the reaction chamber is between about 150 Pa and about 300 Pa.

In various embodiments, the temperature within the reaction chamber is between about 300 and about 500° C.

In various embodiments, the plasma is provided using an RF power of between about 75 W and about 300 W for a 300 mm substrate.

In various embodiments, the boron nitride film is deposited at a rate of greater than 0.03 nm/min. In various embodiments, the boron nitride film is deposited at a rate of greater than 0.05 nm/min. In various embodiments, the boron nitride film is deposited at a rate of about 1 nm/min. In accordance with further examples, the boron nitride film is deposited at a rate of between about 0.08 and about 2.0 nm/min.

Further described herein is a structure comprising a boron nitride film formed according to the methods of the present disclosure.

In various embodiments, a dielectric constant of the boron nitride film is less than 3.5. In various embodiments, the dielectric constant of the boron nitride film is less than 3.0. In various embodiments, the dielectric constant of the boron nitride film is less than 2.8.

Further described herein is a reactor system for performing the methods of the present disclosure.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
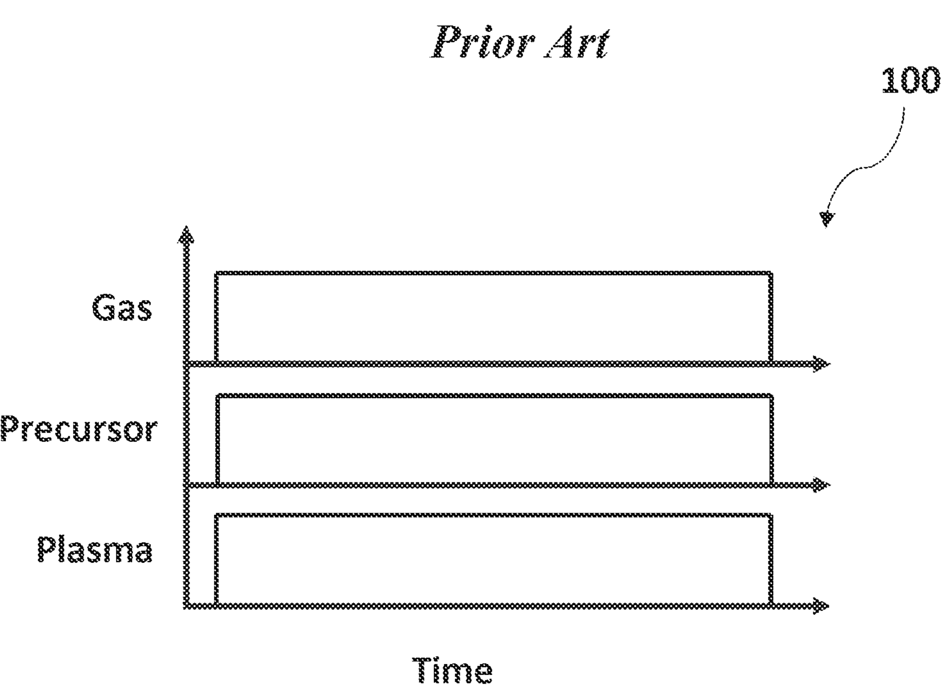
FIG. 1 illustrates a deposition sequence according to previously known methods.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses described herein and obvious modifications and equivalents thereof. Thus, it is intended that the scope of the invention disclosed should not be limited by the particular disclosed embodiments described below.

As used herein, the term "substrate" may refer to any underlying material or materials that may be used to form, or upon which, a device, a circuit, or a film may be formed. Further, the substrate can include various features, such as recesses, lines, and the like formed within or on at least a portion of a layer of the substrate.

In some embodiments, the terms "film" and "layer" may be used interchangeably and refer to a layer extending in a direction perpendicular to a thickness direction to cover an entire target or concerned surface, or simply a layer covering a target or concerned surface. In some embodiments, the terms "film" or "layer" refer to a structure having a certain thickness formed on a surface. A film or layer may be constituted by a discrete single film or layer having certain characteristics. Alternatively, a film or layer may be constituted of multiple films or layers, and a boundary between adjacent films or layers may or may not be clear and may or may not be established based on physical, chemical, and/or any other characteristics, formation processes or sequence, and/or functions or purposes of the adjacent films or layers.

In some embodiments, "gas" can include material that is a gas at normal temperature and pressure, a vaporized solid and/or a vaporized liquid, and may be constituted by a single gas or a mixture of gases, depending on the context. A gas can include a process gas or other gas that passes through a gas supply unit, such as a shower plate, a gas distribution device, or the like. A gas can be a reactant or precursor that takes part in a reaction within a reaction chamber and/or include ambient gas, such as air.

The term "cyclical deposition process" or "cyclical deposition method" may refer to the sequential introduction of precursors (reactants) into a reaction chamber to deposit a layer over a substrate and includes processing techniques such as atomic layer deposition and cyclical chemical vapor deposition.

The term "cyclic chemical vapor deposition process" may refer to a chemical vapor deposition process in which one or more precursors are provided to a reaction chamber intermittently, i.e., in pulses. A plasma enhanced cyclic chemical vapor deposition process may refer to a cyclic chemical vapor deposition process in which a plasma is used to generate reactive species.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments. Percentages set forth herein are absolute percentages, unless otherwise noted.

It shall be understood that the term "comprising" is open ended and does not exclude the presence of other elements or components, unless the context clearly indicates otherwise. The term "comprising" includes the meaning of "consisting of." The term "consisting of" indicates that no other features or components are present than those mentioned, unless the context indicates otherwise.

The present disclosure generally relates to methods and systems for depositing a boron nitride film on a substrate. As set forth in more detail below, exemplary methods and systems described herein can be used to deposit boron nitride films with low-k value, low WERR, and improved electrical properties.

As illustrated in FIG. 1, a previous method 100 of depositing boron nitride films includes providing continuous reactant gas (gas), precursor, and plasma. In method 100, the precursor, reactant, and plasma are provided continuously. In contrast, the methods described herein pulse the precursor, while other parameters, such as reactant flow and/or plasma may be continuous.

Figure 2:
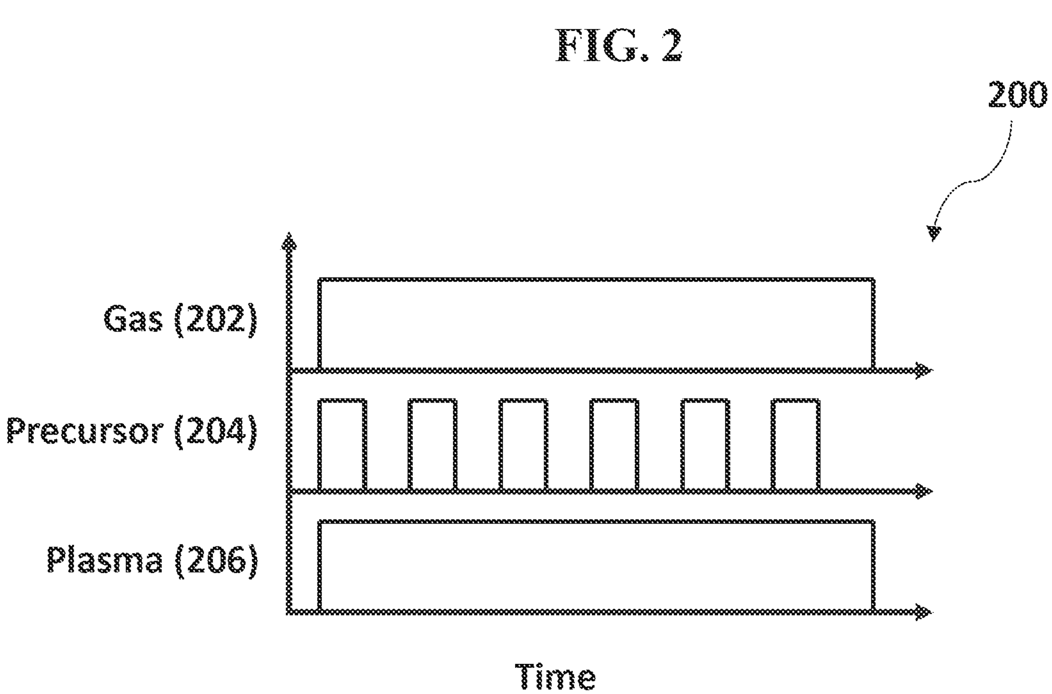
FIG. 2 illustrates a deposition sequence in accordance with at least one embodiment of the disclosure.

FIG. 2 illustrates a schematic representation of a pulsed deposition process sequence 200 in accordance with at least one embodiment of the disclosure. In FIG. 2, the precursor (204) is pulsed into a reaction chamber, while a reactant gas (202) and plasma (206) are provided continuously through the one or more precursor pulses.

Figure 3:
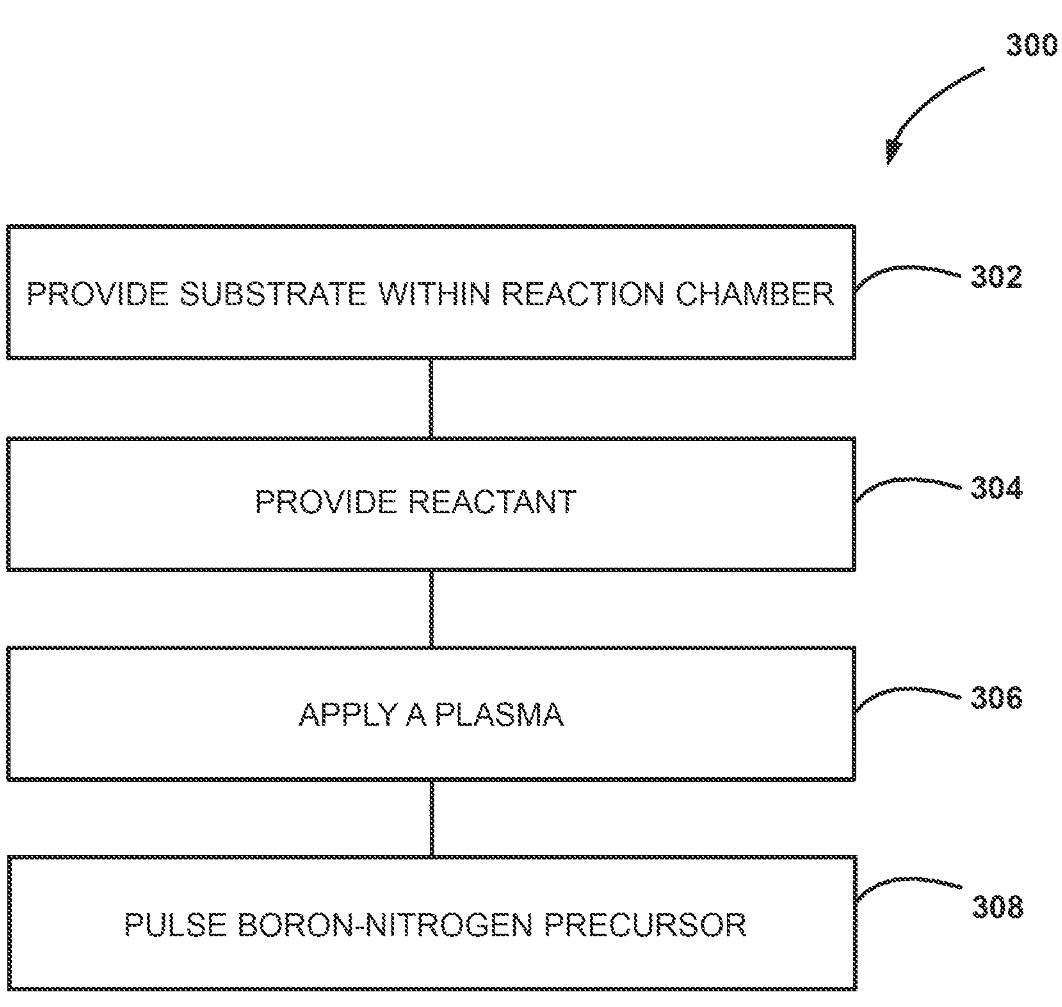
FIG. 3 illustrates a method in accordance with at least one embodiment of the disclosure.

FIG. 3 illustrates a method of 300 of forming a boron nitride film on a substrate. Method 300 can be performed using process sequence 200. Method 300 includes the steps of providing a substrate within a reaction chamber (302), providing a reactant into the reaction chamber (304), forming a plasma using the reactant (306), and pulsing a precursor into the reaction chamber (308). The steps of providing the reactant 304, forming the plasma 306, and pulsing the precursor 308 can overlap, as illustrated in the process sequence 200. Further, as illustrated in FIG. 2, various steps of method 300 (e.g., step 308) can be repeated while overlapping other steps. Method steps of providing a reactant 304, forming a plasma 306, and pulsing a precursor 308 can be the same or similar to process sequence steps gas 202, plasma 206, and precursor 204, respectively, described above. As used herein, the term overlap means that one or more steps overlap in time within a reaction chamber.

In some embodiments, the process is a cyclic PECVD process. In some embodiments, the cyclic PECVD process comprises pulsed precursor flow. Pulsed precursor flow comprises providing precursor to a reaction chamber in pulses, i.e. intermittently. Precursor pulses can be separated by a purge. During a purge, precursor flow can be stopped while a reactant continues to be supplied to the reaction chamber. Additionally or alternatively, the purge can be effected while a plasma continues to be formed in the reaction chamber.

In step 302, a substrate is provided within a reaction chamber. The reaction chamber can then be brought to a process temperature and pressure. In some embodiments, the reaction chamber is maintained at a temperature of between 30° and 500° C., or at 400° C. throughout method 300. In some embodiments, the reaction chamber is maintained at a pressure of between 150 to 300 Pa throughout method 300.

During step 304, the reactant is provided to the reaction chamber. In some cases, during step 304, the reactant comprises a carrier gas. It shall be understood that a carrier gas refers to a gas that is used to carry or entrain a precursor to the reaction chamber. In some embodiments, the reactant is a noble gas. In some embodiments, the reactant is an argon-containing gas. In some embodiments the argon-containing gas also includes hydrogen or nitrogen. In some embodiments, the reactant includes between 30 and 99% argon and/or He and/or between 1 and 70% hydrogen. In some embodiments, the reactant includes between 10 and 90% argon and/or between 10 and 90% nitrogen.

In some embodiments, the flow rate of the noble gas (e.g., argon) is between 0.75 and 20 slm, or 2.5 slm. In some embodiments, the gas flow rate of the hydrogen is between 0.05 and 1.5 slm, or between 0.05 and 0.75 slm. In some embodiments, the gas flow rate of the nitrogen is between 1 and 20 slm. The reaction chamber may be maintained at a temperature of between 30° and 500° C., or at 400° C., and a pressure of between 150 to 300 Pa during step 304, as noted above.

In step 306, the plasma may be an RF plasma. In some cases, the plasma is a direct plasma formed within the reaction chamber. In some embodiments, a plasma power of between 100 W to 150 W is used for forming the plasma. It shall be understood that these plasma power ranges are provided for 300 mm wafers. The ranges can be readily converted to units of W/cm2 to obtain equivalent RF power values for different substrate sizes.

In some embodiments, the plasma is provided directly using capacitively coupled plasma (CCP). In some embodiments, a plasma frequency of between 100 KHz and 2 GHz is used. In some embodiments, a plasma frequency of 13.56 MHz is used. The reaction chamber may be maintained at a temperature of between 30° and 500° C., or at 400° C., and a pressure of between 150 to 300 Pa during step 306, as noted above.

During step 308, each pulse of precursor may be provided for between 0.01 and 1 seconds, or 0.1 seconds. The amount of time between pulses may be between 0.1 and 10 seconds.

In some embodiments, the precursor consists of boron, nitrogen, and hydrogen. In some embodiments, the precursor can be represented by a chemical formula according to formula (a)

(a)

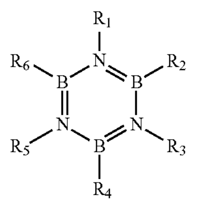

with $R_1$, $R_2$, $R_3$, $R_4$, $R_5$, and $R_6$ independently selected from H and a halogen. In some embodiments, at least one of $R_1$, $R_2$, $R_3$, $R_4$, $R_5$, and $R_6$ is F or Cl. Alternatively, $R_1$, $R_2$, $R_3$, $R_4$, $R_5$, and $R_6$ may all be H. Accordingly, in some embodiments, the precursor is borazine. In some embodiments, the precursor is a substituted borazine. In some embodiments, the precursor does not comprise carbon. In accordance with further examples, one or more halogens may be selected from the group consisting of F, Cl, Br, and I. The reaction chamber may be maintained at a temperature of between 30° and 500° C., or at 400° C., and a pressure of between 150 to 300 Pa during step 308, as noted above.

In some embodiments, the boron nitride film may be deposited at a rate of 0.03 nm/min. In some embodiments, the boron nitride film may be deposited at a rate of greater than 0.03 nm/min, or greater than 0.05 nm/min.

Figure 4:
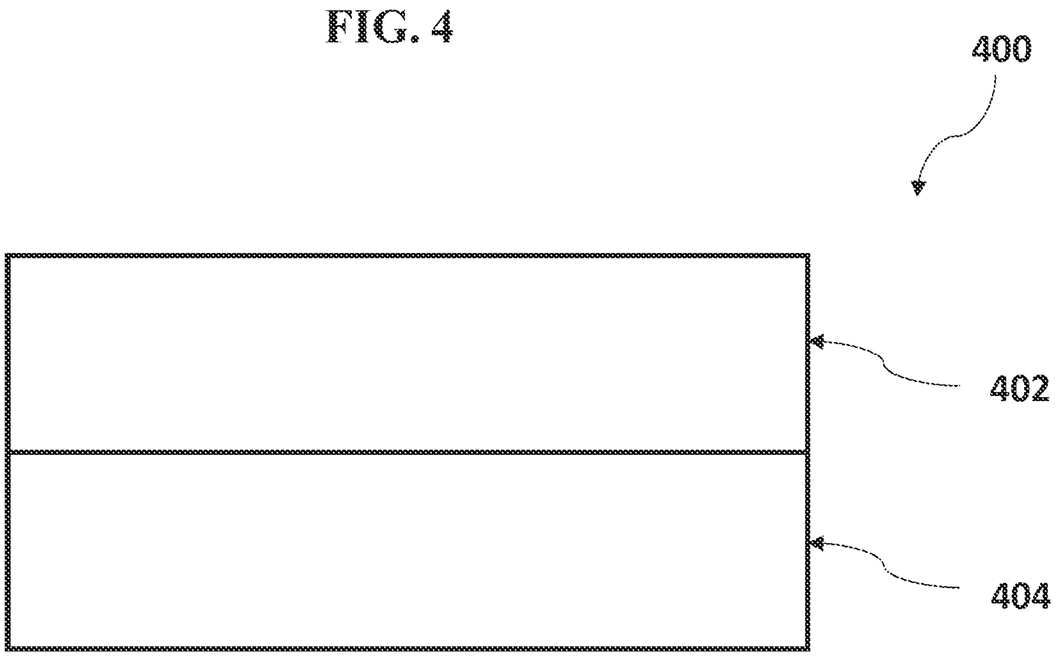
FIG. 4 illustrates a structure in accordance with at least one embodiment of the disclosure.

FIG. 4 illustrates a structure 400 in accordance in accordance with exemplary embodiments of the disclosure. Structure 400 can be formed, at least in part, according to a method as described herein, such as method 300.

Structure 400 includes a substrate 404 and a boron nitride film 402 formed, e.g. using method 300 and/or process sequence 200. The dielectric constant of the boron nitride film 402 may be less than 3.5, less than 2.8, less than 2, or between about 2.8 and about 3.5, or between about 2 and about 3, or between about 1.5 and about 2. A refractive index of boron nitride film 402 can be between about 1.5 and about 1.75 or about 1.75 and about 2.

Figure 5:
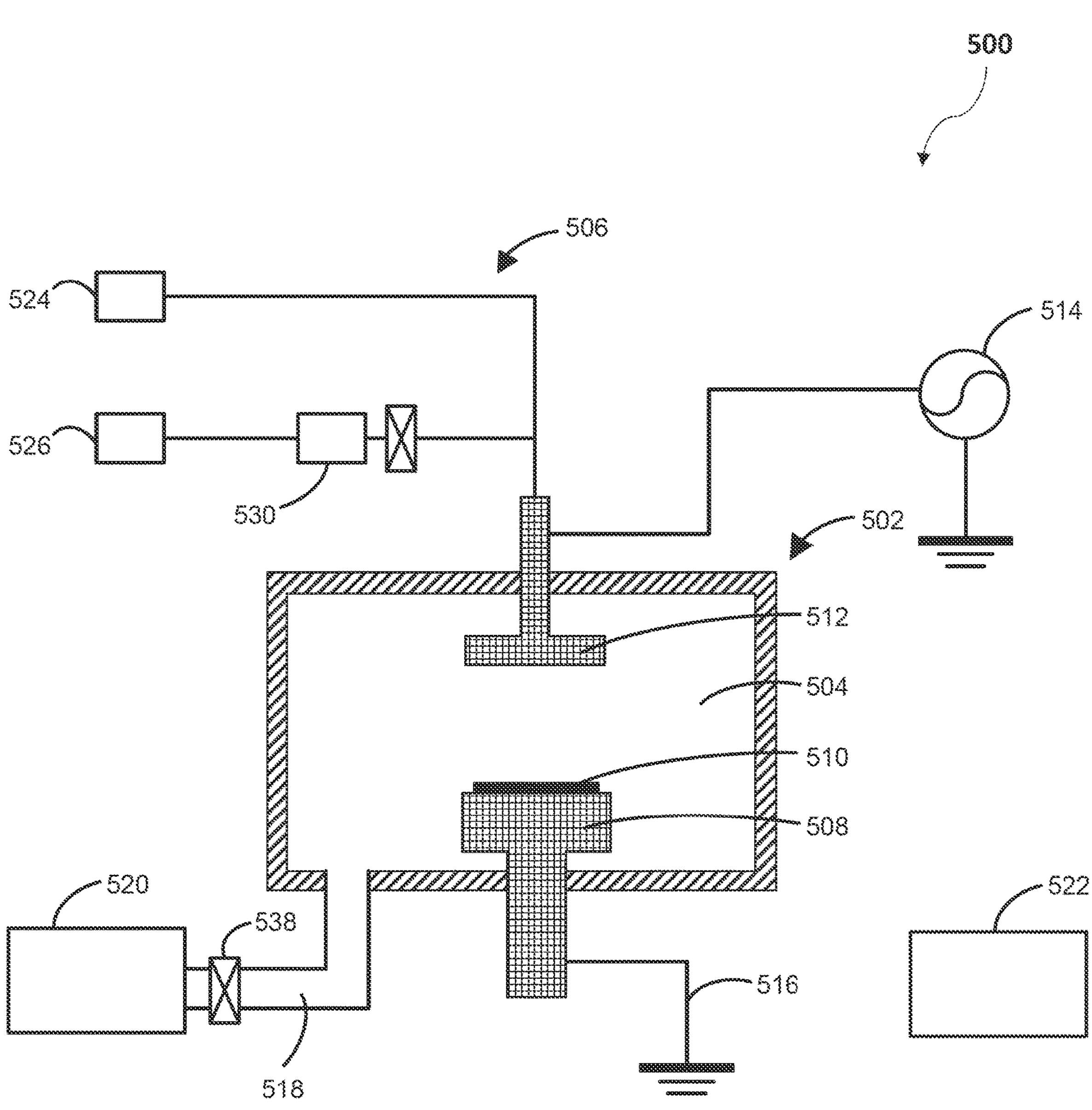
FIG. 5 illustrates a system in accordance with at least one embodiment of the disclosure.

FIG. 5 illustrates a system 500 in accordance with exemplary embodiments of the disclosure. System 500 can be used to perform a method as described herein and/or to form a structure, or portion thereof, as described herein.

System 500 includes a reaction chamber 502, including a reaction space 504, a susceptor 508 to support a substrate 510, a gas distribution assembly 512, a gas supply system 506, a plasma power source 514, and a vacuum source 520. System 500 can also include a controller 522 to control various components of system 500.

Reaction chamber 502 can include any suitable reaction chamber, such as a chemical vapor deposition (CVD) reaction chamber.

Susceptor 508 can include one or more heaters to heat substrate 510 to a desired temperature. Further, susceptor 508 can form an electrode. In the illustrated example, susceptor 508 forms an electrode coupled to ground 516.

Gas distribution assembly 512 can distribute gas to reaction space 504. In accordance with exemplary embodiments of the disclosure, gas distribution assembly 512 includes a showerhead, which can form an electrode. In the illustrated example, gas distribution assembly 512 is coupled to a power source 514, which provides power to gas distribution assembly 512 to produce a plasma with reaction space 504 (between gas distribution assembly 512 and susceptor 508). Power source 514 can be an RF power supply.

Gas supply system 506 can include one or more gas sources 524 and 526, and a precursor source 530. Gas source 524 can include, for example, a reactant gas as described herein. Precursor source 530 can include a precursor as described herein. Vacuum source 520 can include any suitable vacuum pump, such as a dry pump. Vacuum source 520 can be coupled to reaction chamber 502 via line 518 and controllable valve 538.

Controller 522 can be coupled to various valves, flowmeters (e.g., coupled to one or more of sources 524 and 526), heaters, thermocouples, and the like of system 500. Controller 522 can be configured to cause system 500 to perform various steps as described herein.

EXAMPLES

Example 1

Various plasma compositions for depositing the boron nitride film were performed using a pulsed PECVD process. Table 1 outlines the reactor conditions in which only the reactants and their flow rates were varied across experiments (e.g. argon flow rate (Dil-Ar slm), nitrogen flowrate (Dil-$N_2$ slm), helium flowrate (He slm), and hydrogen flowrate $H_2$ slm)). The other process conditions were the same in each experiment. The reactor was maintained at 400° C. throughout the process. Argon was used as a carrier gas at a flow rate of 0.5 slm. The borazine precursor was provided with plasma in pulses of 0.1 seconds (Feed [s]). Plasma was provided for 10 seconds between each precursor pulse (RF [s]). A plasma frequency of 13.56 MHz was used. The resulting film thickness, refractive index (RI) and non-uniformity (% NU) were measured using spectroscopic ellipsometry (Aleris HX). As shown in Table 1, use of helium as a reactant with argon resulted in a lower refractive index (RI) compared to use of hydrogen and nitrogen. For these conditions, helium exhibited a relatively small effect on the RI when combined with hydrogen and nitrogen.

TABLE 1

| Deposition | Ar•$H_2$ | Ar•He•$H_2$ | Ar•He | Ar•He•$N_2$ | Ar•$N_2$ |
|---|---|---|---|---|---|
| Temp [° C.] | 400 | 400 | 400 | 400 | 400 |
| Carrier Ar [slm] | 0.5 | 0.5 | 0.5 | 0.5 | 0.5 |
| Dil-Ar [slm] | 1.25 | 0.75 | 1.5 | 0.75 | 1.25 |
| Dil-N2 [slm] | | | | 1.25 | 0.75 |
| He [slm] | | 0.5 | 0.5 | 0.5 | |
| $H_2$ [slm] | 0.75 | 0.75 | | | |
| RC Press [Pa] | 300 | 300 | 300 | 300 | 300 |
| HRF Power [W] | 75 | 75 | 75 | 75 | 75 |
| Feed [s] | 0.1 | 0.1 | 0.1 | 0.1 | 0.1 |
| RF [s] | 10 | 10 | 10 | 10 | 10 |
| Thickness [nm] | 7.6 | 8.6 | 18.3 | 16.8 | 18.1 |
| RI [@633 nm] | 1.78 | 1.78 | 1.74 | 1.79 | 1.80 |
| % NU | 2.6 | 4.1 | 1.0 | 2.4 | 4.4 |

Example 2

Boron nitride deposition using a reactant gas including argon and hydrogen was compared with deposition using a reactant gas including argon and nitrogen in a pulsed PECVD process. The general process conditions are shown in Table 2. The reactor was maintained at 400° C. Argon was used as a carrier gas at a flow rate of 0.5 slm. The borazine precursor was provided with plasma in pulses of 0.1 seconds (Feed [s]).

In the process using argon and nitrogen as reactants (Ar·$H_2$), plasma was provided for a duration in the range of 1-10 seconds between each precursor pulse (RF [s]). A plasma frequency of 13.56 MHz was used. The pressure within the reaction chamber was maintained at a range of 150-500 Pa. The argon reactant was provided at a flow rate of 1.25 slm. The hydrogen was provided at a flow rate of between 0.05-0.75 slm. The RF power was provided at 100-150 W.

In the process using argon and nitrogen as reactants (Ar·$N_2$), plasma was provided for a duration in the range of 5-15 seconds between each precursor pulse (RF [s]). A plasma frequency of 13.56 MHz was used. The pressure within the reaction chamber was maintained at a range of 200-500 Pa. The argon reactant was provided at a flow rate of between 0.5-1.55 slm. The nitrogen was provided at a flow rate of between 0.45-1.5 slm. The RF power was provided at 75-200 W.

TABLE 2

| BN Deposition | | |
|---|---|---|
| | Ar•$H_2$ | Ar•$N_2$ |
| Temp [C.] | 400-500 | 400 |
| Pressure [Pa] | 150-500 | 200-500 |
| Carrier Ar [slm] | 0.5 | 0.5 |
| Ar [slm] | 1.25 | 0.5-1.55 |
| H2 [slm] | 0.05-0.75 | |
| N2 [slm] | | 0.45-1.5 |
| Feed [s] | 0.1 | 0.1 |
| RF [s] | 1-10 | 5-15 |
| Power [W] | 100-150 | 75-200 |

Several experiments were run to determine desirable reactant flow rate, RF pulse duration, power, pressure, and temperature conditions within the ranges shown in Table 2. Three exemplary experiments using argon and hydrogen as reactants are shown in Table 3.

TABLE 3

| HQ.Ar•H2 | H2 [slm] | RF [s] | Power [W] | Pressure [Pa] | Temp [° C.] |
|---|---|---|---|---|---|
| #1 | 0.425 | 16.3 | 53 | 500 | 400 |
| #2 | 0.75 | 10 | 150 | 300 | 400 |
| #3 | 0.75 | 10 | 150 | 300 | 500 |

The properties of the film deposited using the argon and hydrogen (Ar·$H_2$) reactant, as described in connection with the date in Tables 2 and 3, are shown in Tables 4 and 5. Table 4 shows the dielectric values (k-value), leakage current, and electric field data for the three experiments described in connection with the data in Table 3. In order to measure k-value, platinum (Pt) was evaporated on the back and front of the sample to make a metal-insulator-metal (MiM) capacitor structure (70 nm Pt/15 nm BN/Si Wafter/70 nm Pt). For the deposition of Pt on top of the BN, a mask was used, resulting in Pt dots in the range of 50-200 μm. The samples were then analyzed with a Keithley 4200. The k-values were determined using a capacitance-voltage (CV) measurement configuration in the range of 1-100 kHz. The results show that the films deposited in the three experiments had good electrical properties including low-k, low leakage, and high breakdown. The film deposited in experiment #3 exhibited slow breakdown (SBD). Table 5 shows the refractive index (RI), density (p), and the boron, nitrogen, oxygen, carbon, and silicon composition of the films deposited in the three experiments. A higher RI, density and stoichiometry of boron/nitride correlate with a lower k-value, as exhibited in experiment #2. The film composition was measured using a K-Alpha X-ray Photoelectron Spectrometer (XPS) system (Thermo Scientific). Overall, the results of these three exemplary experiments and other experimental data not shown suggest that a temperature range of 350-425° C. may be preferred, that film properties improve with increasing pressure (over a tested range of 150-500 Pa), that film properties improve with increasing power, and that the an RF duration between precursor pulses of about 10 seconds is preferred.

TABLE 4

| | | Leakage current [A/cm$^2$] | | E-field [MV/cm] | |
|---|---|---|---|---|---|
| | | | | Leak at $10^{-3}$ | Breakdown |
| HQ.Ar | K-value | at 2 MV/cm | at 4 MV/cm | [A/cm$^2$] | MV |
| #1 | 4.3 | 1.3E−06 | 1.7E−04 | 5.1 | 5.5 |
| #2 | 3.8 | 9.6E−09 | 1.2E−06 | 5.9 | 9.6 |
| #3 | 5.3 | 3.1E−06 | 5.6E−04 | 4.2 | SBD |

TABLE 5

| HQ.Ar | RI | ρ [g/cm$^3$] | B [%] | N [%] | O [%] | C [%] | Si [%] |
|---|---|---|---|---|---|---|---|
| #1 | 1.815 | 1.89 | 51.6 | 36.6 | 8.6 | 2.7 | 0.4 |
| #2 | 1.829 | 1.92 | 51.7 | 40.7 | 5.2 | 2.2 | 0.3 |
| #4 | 1.766 | 1.66 | 54 | 31.3 | 11.6 | 2.9 | 0.3 |

Tables 6 and 7 illustrate the aging of a boron nitride film deposited using the Ar·$H_2$ reactant. The process parameters of experiment #2 shown in Table 3 were used. The results show that the film was stable over time. The initial thickness change of 0.5 nm is possibly due to surface oxide formation, but the composition, RI, and thickness showed minimal differences over 30 days.

TABLE 6

| Ar•H2 | Si [%] | B [%] | C [%] | N [%] | O [%] |
|---|---|---|---|---|---|
| 5 Days | 0.5 | 55.7 | 1.6 | 36.9 | 5.2 |
| 30 Days | 0.8 | 56.7 | 1.2 | 35.5 | 5.7 |

TABLE 7

| Ar•H2 | Thickness [nm] | RI [@633 nm] |
|---|---|---|
| As Deposited | 18.23 | 1.83 |
| 10 Days | 18.74 | 1.83 |
| 18 Days | 18.77 | 1.82 |

Table 8 illustrates the wet etch rate ratio (WERR) of a boron nitride film deposited using the Ar·$H_2$ reactant. The process parameters of experiment #2 shown in Table 3 were used. Hydrofluoric acid (HF) was used at 0.5% in water. The results show that the WERR of the tested film saturated to 0.34 nm independently of exposure time, and only the surface oxide was etched. The WERR of bulk film was close to 0. Sequential etches on the same wafer show that native oxide formed after each etch, and was removed each time. This resulted in the 0.34 nm removed. As the exposure time increased, etched thickness stayed the same (the native oxide), which means that WER/WERR decreases with exposure time as the bulk boron nitride film is not etched.

TABLE 8

| Ar•H2 Planar | Time [s] | Thx Change [nm] | WER [nm/min] | WERR |
|---|---|---|---|---|
| 0.5% HF | 20 | 0.25 | 0.74 | 0.34 |
| | 120 | 0.34 | 0.17 | 0.08 |
| | 240 | 0.34 | 0.09 | 0.04 |

Referring back to Table 2, four experiments were run to determine preferred reactant flow rates, RF pulse duration, power, pressure, and temperature conditions within the ranges shown using argon and nitrogen as reactants. Four exemplary experiments using argon are shown in Table 9.

TABLE 9

| HQ.Ar. N2 | N2 [slm] | Ar [slm] | RF [s] | Power [W] | Pressure [Pa] | Temp [° C.] |
|---|---|---|---|---|---|---|
| #1 | 1.5 | 0.5 | 15 | 75 | 200 | 400 |
| #2 | 1.5 | 0.5 | 10 | 200 | 500 | 400 |
| #3 | 0.7 | 1.3 | 15 | 138 | 500 | 400 |
| #4 | 1.5 | 0.5 | 15 | 200 | 200 | 400 |

The properties of the film deposited using the argon and nitrogen (Ar·$N_2$) reactant, as described in Tables 2 and 9, are shown in Tables 10 and 11. Measurements were done as described for the Ar·$H_2$ films. Table 10 shows the k-value, leakage current, and electric field data for the four experiments described in Table 9. The results show that, similarly to the Ar·$H_2$ film, the Ar·$N_2$ films deposited in the four experiments had a reduced k value. However, the leakage and breakdown were not as good as the Ar·$H_2$ films. The films deposited exhibited relatively high leakage, and experiments #1-3 exhibited fast breakdown (FBD), where the films immediately broke down when voltage was applied. Table 11 shows the refractive index (RI), density (ρ), and the boron, nitrogen, oxygen, carbon, and silicon composition of the films deposited in the four experiments. The Ar·$N_2$ film also had a similar composition as the Ar·$H_2$ film, with the density and RI further improved. However, the WERR and stability properties (not shown) of the Ar·$N_2$ film were not as good as the Ar·$H_2$ film. After 10 days, the WERR was 0.2-3.6.

TABLE 10

| | | Leakage current [A/cm$^2$] | | E-field [MV/cm] | |
|---|---|---|---|---|---|
| | | | | Leak at $10^{-3}$ | Breakdown |
| HQ.Ar | K-value | at 2 MV/cm | at 4 MV/cm | [A/cm$^2$] | MV |
| #1 | 3.5 | 3.9E−01 | 2.6E+00 | 0.3 | FBD |
| #2 | 2.8 | 4.3E−08 | 4.4E-05 | 2.9 | FBD |
| #3 | 3.1 | 2.0E−01 | 1.8E+00 | 0.8 | FBD |
| #4 | 3.0 | 5.7E−02 | 7.8E−01 | 1.8 | 1.8 |

TABLE 11

| HQ.Ar.N2 | RI | ρ [g/cm$^3$] | B [%] | N [%] | O [%] | C [%] | Si [%] |
|---|---|---|---|---|---|---|---|
| #1 | 1.73 | 1.90 | 54.0 | 33.8 | 7.5 | 4.0 | 0.8 |
| #2 | 1.93 | 2.27 | 55.2 | 34.4 | 8.9 | 1.6 | 0.0 |
| #3 | 1.90 | 1.99 | 48.6 | 40.2 | 6.8 | 3.4 | 1.0 |
| #4 | 1.89 | 2.13 | 49.4 | 41.8 | 5.4 | 3.0 | 0.4 |

An overview of the properties of the boron nitride film deposition using the process described herein (Ar·$H_2$ and Ar·$N_2$) in comparison to the previously used method (Hong et al. Nature, vol. 582 (2020)) is shown in Table 10. To summarize, the Ar·$H_2$ reactants yield films with relative low k and very good leakage and breakdown properties, while the Ar·$N_2$ reactants yield films with even lower k, but not as good leakage and breakdown properties.

TABLE 10

| Item | Previous Method | Ar•$H_2$ | Ar•$N_2$ |
|---|---|---|---|
| Growth rate | 0.03 nm/min | 1 nm/min | 1 nm/min |
| K-value (100 kHz) | 1.78 | 3.8 | 2.8 |
| Leakage | 2 6.3E−6 A/$cm^2$ at 0.3 V | 9.6*E−9 @ 2MV | 2.9*E−3 @ 2 MV |
| Breakdown field | 7.3 MV/cm | 9.6 MV/cm | FBD |
| Refractive Index | 1.37 | 1.81-1.85 | 1.75-2.00 |
| Stability (Air) | — | >30 | Slow Aging |
| WERR (dHF) | — | 0 | 0.2-3.6 |
| Composition (XPS) | B/N 1:1.08 | B/N 1/0.79 | B/N 1/0.84 |
| Density (XRR) | 2.1-2.3 | 1.89-1.98 | 1.89-2.26 |
| Crystallinity (XRD) | amorphous | amorphous | — |

The example embodiments of the disclosure described above do not limit the scope of the invention since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A cyclic deposition method of depositing a boron nitride film on a surface of a substrate, the method comprising:

providing the substrate in a reaction chamber, the reaction chamber comprising a gas distribution assembly, a susceptor, and a reaction space;

providing a reactant into the reaction space;

forming a plasma within the reaction space between the gas distribution assembly and the susceptor using the reactant; and pulsing a precursor into the reaction space to thereby form the boron nitride film, wherein the precursor comprises boron and nitrogen;

wherein the reactant is provided continuously during the pulsing of the precursor into the reaction chamber;

wherein the reactant consists of 30-99% argon and/or helium and 1-70% hydrogen; and wherein the plasma is continuous during a plurality of steps of pulsing the precursor.

2. The method of claim 1, wherein the precursor consists of boron, nitrogen, and hydrogen.

3. The method of claim 1, wherein the precursor is represented by a chemical formula:

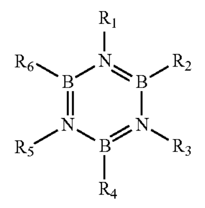

wherein at least one of $R_1$, $R_2$, $R_3$, $R_4$, $R_5$, and $R_6$ is F or Cl.

4. The method of claim 1, wherein the precursor consists of borazine.

5. The method of claim 1, wherein the reactant consists of argon and helium and hydrogen.

6. The method of claim 5, wherein the reactant consists of argon and hydrogen.

7. The method of claim 1, wherein the reactant consists of 30-99% argon or helium and hydrogen.

8. The method of claim 1, wherein each pulse of precursor is provided for between 0.01 and 1 seconds and amount of time between pulses is between 0.1 and 10 seconds.

9. The method of claim 1, wherein the susceptor comprises an electrode coupled that is to ground.

10. The method of claim 1, wherein the method comprises a cyclical CVD process.

11. The method of claim 1, wherein a pressure within the reaction chamber is between about 150 Pa and about 300 Pa.

12. The method of claim 1, wherein the temperature within the reaction chamber is between about 300 and about 500° C.

13. The method of claim 1, wherein the plasma is provided using an RF power of between about 75 W and about 300 W for a 300 mm substrate.

14. The method of claim 1, wherein the boron nitride film is deposited at a rate of greater than 0.03 nm/min.

15. The method of claim 1, wherein the boron nitride film is deposited at a rate of greater than 0.05 nm/min.

16. The method of claim 6, wherein the reactant comprises a carrier gas.

* * * * *